United States Patent [19]
Williams

[11] Patent Number: 6,133,795
[45] Date of Patent: Oct. 17, 2000

[54] OSCILLATOR CIRCUIT

[76] Inventor: Roscoe Charles Williams, 46 Fearnley Crescent, Kempston, Bedfordshire MK42 8NL, United Kingdom

[21] Appl. No.: 09/112,854

[22] Filed: Jul. 10, 1998

Related U.S. Application Data

[63] Continuation-in-part of application No. 08/765,082, Dec. 20, 1996, Pat. No. 5,818,381.

[30] Foreign Application Priority Data

Jun. 24, 1994 [GB] United Kingdom ................ 9412772

[51] Int. Cl.$^7$ ........................................... H03B 7/14
[52] U.S. Cl. ........................ 331/9; 331/96; 331/37; 331/108 C; 331/177 V; 331/4; 331/107 DP; 331/107 G; 455/318; 455/323; 455/325; 455/330; 455/126
[58] Field of Search ........................ 331/4, 10, 107 DP, 331/42, 37, 40, 41, 177 V, 96, 9, 108 C, 107 G; 455/318, 323, 325, 330, 311, 313, 316, 126

[56] References Cited

U.S. PATENT DOCUMENTS

| | | |
|---|---|---|
| 2,500,638 | 3/1950 | Krauth . |
| 2,511,599 | 6/1950 | Rochester . |
| 2,560,587 | 7/1951 | Miller . |
| 3,172,075 | 3/1965 | Kay . |
| 3,366,922 | 1/1968 | Kay . |
| 3,383,682 | 5/1968 | Stephens, Jr. . |
| 3,611,374 | 10/1971 | Draysey . |
| 3,654,477 | 4/1972 | Benjamin, Jr. . |
| 3,987,402 | 10/1976 | Smith . |
| 4,310,903 | 1/1982 | Kay . |
| 4,574,256 | 3/1986 | Singh . |
| 4,591,806 | 5/1986 | Havens . |
| 4,634,999 | 1/1987 | Braun ........................................... 331/4 |
| 4,814,718 | 3/1989 | Argintaru et al. . |
| 5,199,705 | 4/1993 | Jenkins et al. . |
| 5,229,885 | 7/1993 | Quaglia . |
| 5,294,895 | 3/1994 | Feeney et al. ................................ 331/9 |
| 5,515,056 | 5/1996 | Henderson et al. . |

FOREIGN PATENT DOCUMENTS

| | | |
|---|---|---|
| 0164994 | 12/1985 | European Pat. Off. . |
| 0531877 | 3/1993 | European Pat. Off. . |
| 0536835 | 4/1993 | European Pat. Off. . |
| 0669199 | 8/1995 | European Pat. Off. . |
| 2562679 | 10/1985 | France . |
| 2931837 | 2/1981 | Germany . |
| 3133645 | 3/1983 | Germany . |
| 3613258 | 10/1987 | Germany . |
| 2276055 | 9/1994 | United Kingdom . |

*Primary Examiner*—Arnold Kinkead
*Attorney, Agent, or Firm*—Leo Zucker

[57] ABSTRACT

A stabilised voltage controlled oscillator circuit comprises a closed loop circuit containing a voltage controlled oscillator (34), a local oscillator (40) and a harmonic mixer (38) that mixes a stabilised local oscillator (LO) frequency signal and a radio frequency (RF) signal from the voltage controlled oscillator (34) to obtain an intermediate frequency (IF) signal. An IF amplifier (42) is connected to a linear frequency discriminator (44) that provides an output signal to a summing amplifier (46), which is connected to the voltage controlled oscillator (34). The closed loop circuit uses the linear frequency discriminator (44) to provide a feedback signal that stabilises the voltage controlled oscillator (34).

31 Claims, 14 Drawing Sheets

OSCILLATOR CIRCUIT

REFERENCE TO RELATED APPLICATION

This application is a continuation-in-part of my U.S. application Ser. No. 08/765,082 filed Dec. 20, 1996 and entitled "Electronic Viewing Aid". The '082 application was filed under the provisions of 35 USC §371 from International application PCT/GB95/00782 filed Apr. 5, 1995, with a claim for priority based on UK Application GB 9412772.7 filed Jun. 24, 1994. The '082 U.S. application Ser. No. issued as U.S. Pat. No. 5,818,381 on Oct. 6, 1998.

TECHNICAL FIELD

The present invention relates to an oscillator circuit and in particular, but not exclusively, to a temperature stabilised varactor controlled oscillator (VCO) circuit that operates at millimeter wave frequencies, for example in the range 30–220 GHz. According to one preferred embodiment, the invention relates to an oscillator circuit for a frequency modulated continuous wave (FMCW) radar.

BACKGROUND OF THE INVENTION

The electronic tuning characteristics of a typical millimeter wave varactor controlled oscillator are shown in FIG. 1. The slope of the VCO tuning curve changes from 100 MHz/volt at −5V to 50 MHz/volt at −15V, this being a variation of 50%. Such a variation is unacceptable for certain applications, for example FMCW radars, which require a variation of no more than 1%. There is therefore a need for an oscillator circuit having substantially linear tuning characteristics.

The operating frequency of a conventional VCO also changes with variations in the case temperature, the effect being to shift the tuning characteristic vertically relative to the varactor voltage axis. For example, as shown in FIG. 1, the tuning characteristics at case temperatures of +45° C. and −25° C. are separated by 400 MHz at a varactor voltage of −10V, representing a drift in operating frequency with temperature of 5.7 MHz/° C. There is therefore a need for an oscillator circuit having significantly reduced temperature drift.

SUMMARY OF THE INVENTION

The objective of the invention is to provide an oscillator circuit having substantially linear tuning characteristics and a significantly reduced temperature drift.

According to the present invention there is provided an oscillator circuit including:

a voltage controlled oscillator, and a closed loop feedback circuit, said closed loop feedback circuit containing:

a local oscillator, a harmonic mixer connected to receive a stabilised local oscillator (LO) frequency signal from said local oscillator and a radio frequency (RF) signal from an output of said voltage controlled oscillator, said harmonic mixer being arranged to mix said LO frequency signal with said RF signal to obtain an intermediate frequency (IF) signal, and a linear frequency discriminator connected to receive said IF signal and arranged to provide an output voltage signal that is fed to an input of said voltage controlled oscillator to stabilise the voltage controlled oscillator.

The linear frequency discriminator corrects non-linearities in the tuning characteristics of the voltage controlled oscillator (VCO). The local oscillator and the harmonic mixer together reduce temperature drift, the harmonic mixer being required to down-convert the operating frequency since suitable available local oscillators do not operate at frequencies above about 40 GHz.

The inventor has found that the closed loop feedback circuit effectively locks the VCO to the tuning characteristic of the linear discriminator, thereby providing a substantially linear tuning characteristic. Temperature drift is also significantly reduced.

Said local oscillator may include a dielectric resonator. The harmonic mixer is required to down-convert the operating frequency since available dielectric resonator oscillators do not at present operate at frequencies above about 40 GHz.

Said local oscillator may include a Gunn/Impatt diode and a low-pass filter.

Said voltage controlled oscillator may include a voltage-controlled Gunn diode, and may also include a two-section transformer connected to said Gunn diode. Said voltage controlled oscillator may also include a varactor and a bypass capacitor.

The closed loop feedback circuit can also be used to stabilise oscillators such as GaAS FETs (Field Effect Transistors), which exhibit temperature drift due to high substrate temperatures. These oscillators have previously had their frequencies stabilised by reducing their thermal resistance and/or by forming holes in the substrate[1,2,3]. The closed loop feedback circuit may also be used to stabilise MESFET, HEMT and PHEMT transistor oscillators[4,5,6]. Such oscillators generally have lower operating frequencies than Gunn diodes (typically from 100 MHz upwards) but the design principles for the closed loop feedback circuit are substantially the same. The circuit may be constructed using microstrip construction techniques and/or parts of the circuit may consist of a Monolithic Millimeter Wave Integrated Circuit (MMIC).

Advantageously, the voltage controlled oscillator includes an oscillator, a varactor and an impedance-matching transformer. The transformer matches the impedances of the varactor and the oscillator. At high operating frequencies the output impedance of the varactor may be as much as thirty times the input impedance of the oscillator and matching is therefore a very difficult problem. In a preferred embodiment of the invention, the impedances are matched by means of a two-stage transformer.

Advantageously, at least one of said local oscillator, said harmonic mixer and said linear frequency discriminator includes a microstrip circuit and/or a MMIC.

Advantageously, said closed loop feedback circuit includes an IF amplifier connected between said harmonic mixer and said linear frequency discriminator to amplify said IF signal.

Advantageously, said closed loop feedback circuit includes a summing amplifier connected between said linear frequency discriminator and said voltage controlled oscillator, said summing amplifier having a first input that is connected to receive said output voltage signal from said linear frequency discriminator, a second input that is connected to receive a control voltage signal and an output connected to an input of said voltage controlled oscillator to control and stabilise the voltage controlled oscillator.

Advantageously, said circuit including a linear ramp generator that is connected to said second input of said summing amplifier, to provide said control voltage signal.

Advantageously, said oscillator circuit has an operating frequency in the range 30–220 GHz, preferably approximately 94 GHz.

BRIEF DESCRIPTION OF THE DRAWINGS

An embodiment of the present invention will now be described, by way of example, with reference to the accompanying drawings, in which:

FIG. 5b is a graphical representation of a signal generated within the microstrip circuit shown in FIG. 5a;

FIG. 5c is a graphical representation of an output signal generated within the microstrip circuit shown in FIG. 5a;

BEST MODE FOR CARRYING OUT THE INVENTION

Figure 2:
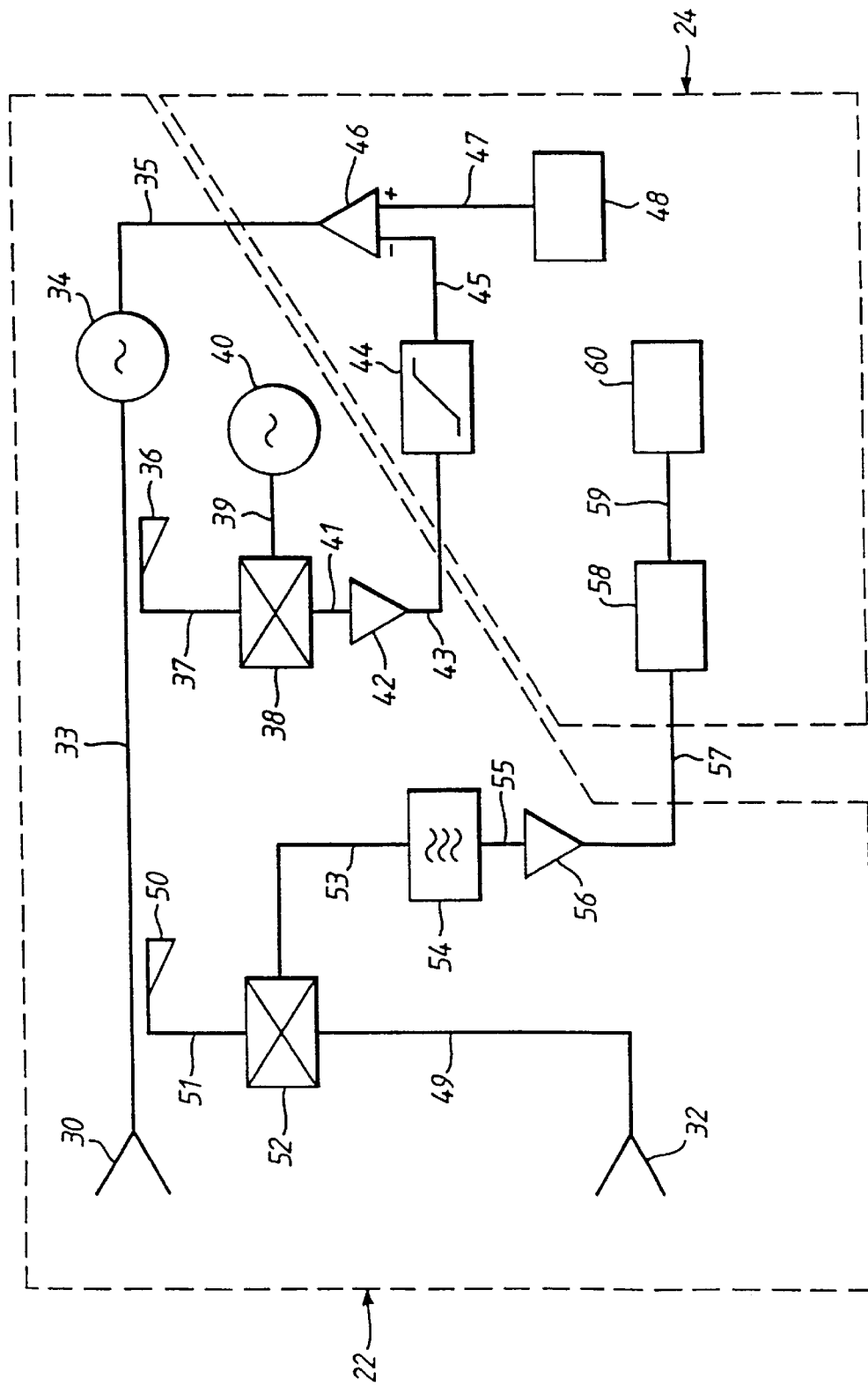
FIG. 2 is a schematic circuit drawing of a radar system including a voltage controlled oscillator circuit according to the present invention.

A preferred embodiment of an oscillator circuit according to the present invention is illustrated in FIGS. 2 to 9. Referring now to FIG. 2, this shows a schematic circuit drawing for a radar front end assembly of an electronic viewing aid in the form of a Spectacle-Mounted, Receiver and Transmitter system 22 (hereinafter referred to as a SMART system 22) and portions of a belt-mountable signal processing and power pack unit 24. The SMART system is described in more detail in International Patent Application No: PCT/GB95/00782 and U.S. Pat. No. 5,818,381 issued Oct. 6, 1998.

The SMART system 22 includes a transmit antenna 30 and a receive antenna 32. Transmit antenna 30 is connected by a microstrip transmission line 33 to the output of a closed loop oscillator circuit according to a preferred embodiment of the present invention, which includes a voltage-controlled oscillator 34, a coupler 36, a harmonic mixer 38, a local oscillator 40, an amplifier 42, a linear frequency discriminator 44 and a summing amplifier 46.

In the operation of this closed loop oscillator circuit, the local oscillator 40 produces a stabilised local oscillator (LO) frequency signal which is fed to one input of the harmonic mixer 38 through a microstrip transmission line 39. A small amount of radio-frequency (RF) energy is taken from the transmission line 33 by the coupler 36, and is fed to a second input of the harmonic mixer 38 through a microstrip transmission line 37. The harmonic mixer 38 mixes the RF signal from the coupler 36 with the LO frequency signal from the local oscillator 40 to obtain a beat frequency, termed the intermediate frequency (IF), which is fed to the input of the intermediate frequency amplifier 42 through a microstrip transmission line 41. Components 36, 38, 40 and 42 all form part of the SMART system 22.

The output signal from the IF amplifier 42 is fed through an output line 43 to a linear frequency discriminator 44 which is housed within the belt-pack unit 24. The frequency discriminator 44 produces an output voltage signal which is fed into one input of the summing amplifier 46 through an output line 45. The summing amplifier 46 is also housed within the power pack unit 24, along with a linear ramp generator 48. The linear ramp generator 48 produces a saw-tooth voltage signal which is fed to a second input of the summing amplifier 46 through an input line 47. An output signal from the summing amplifier 46 is fed to an input of the voltage-controlled oscillator 34 through an output line 35. The voltage-controlled oscillator 34 incorporates a voltage-controlled Gunn diode, and is described in more detail hereinafter with reference to FIGS. 6a and 6b. The wave form of the output signal from the summing amplifier 46 produces an output signal from the voltage-controlled oscillator 34 which is frequency modulated, and this frequency-modulated output signal is fed to the transmit antenna 30 through the microstrip transmission line 33 to close the loop.

This closed loop transmitter circuit uses the frequency discriminator 44 to provide a feedback signal which stabilises the tuneable voltage-controlled oscillator 34. Voltage-controlled oscillator 34 is effectively "locked" to a tuning characteristic of the frequency discriminator 44, as is shown graphically hereinafter with reference to FIGS. 5b and 5c. Since this tuning characteristic is linear, the voltage-controlled oscillator 34 will be tuned linearly.

A user of the electronic viewing aid will wear the SMART system 22 on his or her head in a similar manner as wearing a pair of spectacles. During the operation of the electronic viewing aid, the radar signal transmitted from the transmit antenna can be scanned over objects situated before the user by appropriate movement of the head of the user, and any such object scanned will scatter a certain fraction of the transmitted signal back to the receiver antenna 32 of the SMART system 22. The return signal collected by the receive antenna 32 is fed to one input of a radio-frequency hybrid ring mixer 52 through a microstrip transmission line 49. A coupler 50 located adjacent the transmitter output line 33 acts as a local oscillator by taking a small portion of the transmitter signal and feeding it to a second input of the hybrid ring mixer 52 through a microstrip transmission line 51. Hybrid ring mixer 52 produces an intermediate frequency (IF) signal which is a beat frequency that is the difference in frequency between the transmitted and received signals fed to the two inputs of the hybrid ring mixer 52.

The IF signal from the hybrid ring mixer 52 is fed through a microstrip transmission line 53 to an input of a low-pass filter 54, which is designed to allow only the IF signal to pass through to an input of an IF amplifier 56 via a microstrip transmission line 55. The IF amplifier 56 produces an amplified IF output signal which is fed to an input of an analogue-to-digital converter (ADC) 58 through an output line 57. The amplified IF signal is converted from an analogue signal to a digital signal by the ADC 58, and the digital output signal from the ADC 58 is passed to an input of a signal processing unit 60 through an output line 59. Both the ADC 58 and the signal processing unit 60 are housed in the belt-pack unit 24.

The signal processing unit 60 computes the range and velocity of the object(s) detected relative to the user, and, where possible, identifies said object(s). The signal processing unit 60 contains object-recognition algorithms to aid in the identification of detected objects, and generates an audio output signal embodying all of the detected characteristics of said object(s).

Figure 3:
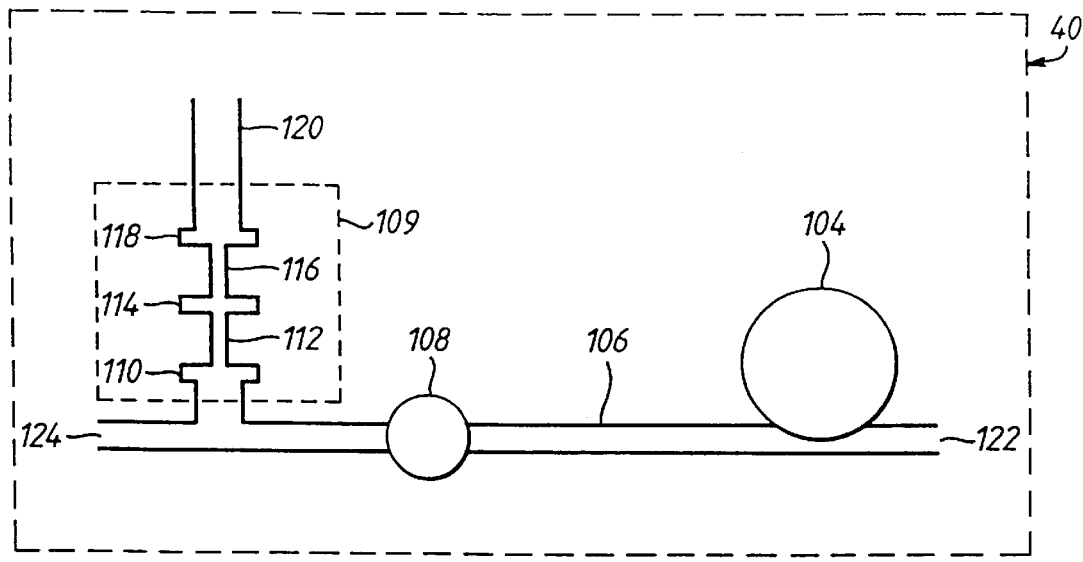
FIG. 3 is a schematic diagram of a microstrip circuit of a local oscillator component of the voltage controlled oscillator circuit shown in FIG. 3.

FIG. 3 shows circuit details of the local oscillator 40 of the closed loop oscillator circuit. The circuit components of the local oscillator 40 are mounted upon an alumina substrate having a relative dielectric constant of 9.6 and a thickness of 0.38 mm. The circuit components comprise a dielectric resonator 104, a Gunn/Impatt diode 108, and a low-pass filter 109. Dielectric resonator 104 is a cylinder with a radius of 1.3345 mm and a height of 1.01098 mm, formed of barium tetratitanate which has a dielectric constant of 36.5. The resonant frequency of the cylindrical resonator 104 is 23.25 GHz. The dielectric resonator 104 is connected to the Gunn/Impatt diode 108 via a 50 ohm microstrip transmission line 106, with the distance between the dielectric resonator 104 and the diode 108 being 5.0 mm. During the operation of the closed loop oscillator circuit, the diode 108 is frequency-stabilised by reason of the dielectric resonator oscillating at a fixed frequency of 23.25 GHz. The low-pass filter 109 is positioned between the diode 108 and a radio-frequency output line 124 of the local oscillator 40, and DC power is fed to the local oscillator 40 via a 50 ohm input line 120. Low-pass filter 109 comprises an array of microstrip elements 110, 112, 114, 116 and 118, elements 110, 114 and 118 being capacitor elements with respective values of 0.0976 pF, 0.0891 pF and 0.0868 pF, and elements 112 and 116 being inductance elements with respective values of 0.4724 nH and 0.2956 nH. A microstrip transmission line 122 connected to the dielectric resonator 104 is coupled to a dummy load.

Figure 4:
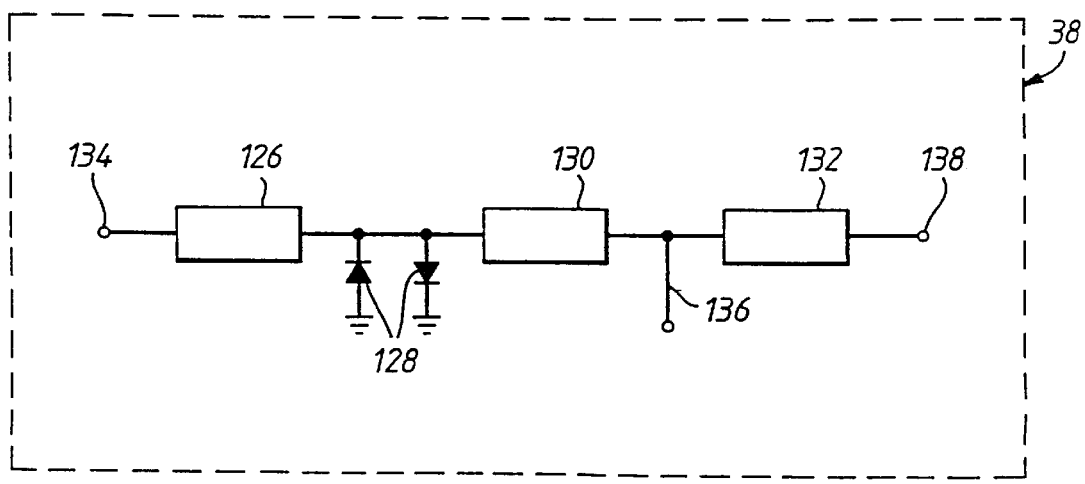
FIG. 4 is a schematic diagram of a microstrip circuit of a harmonic mixer component of the voltage controlled oscillator circuit shown in FIG. 2.

Turning now to FIG. 4, this shows the microstrip circuit of the harmonic mixer 38 of the closed loop oscillator circuit. The circuit components of the harmonic mixer comprise a radio-frequency bandpass filter 126, two beam-lead diodes 128 arranged in an anti-parallel configuration, a low-pass filter 130 and an intermediate frequency filter 132, all connected together in series as shown. Filter 126 is provided with an input port 134, filter 132 is provided with an output port 138, and there is an input port 136 provided in the connection between filters 130 and 132. During the operation of the closed loop oscillator circuit, the output from coupler 36 (see FIG. 2) is fed to port 134, the output from local oscillator 40 is fed to port 136, and the intermediate frequency output signal generated in the harmonic mixer 38 exits from port 138. During operation, the RF bandpass filter 126 is used to suppress all of the higher order of frequencies generated in the mixer 38, and to reject passage of the local oscillator frequency signal and the intermediate frequency signal. The RF bandpass filter 126 consists of a quarter wave line 0.2574 mm long, which gives sufficient rejection of the local oscillator signal and the IF signal during operation thereof. The low-pass filter 130 is used during operation to pass the local oscillator frequency signal whilst preventing the radio-frequency signal from reaching the local oscillator input port 136. This low-pass filter 130 has a cut-off frequency of 25 GHz. The intermediate frequency filter 132 has the same circuit configuration and component values as the low-pass filter 109 used in the local oscillator 40. It is used, during operation of the closed loop oscillator circuit, to extract the intermediate frequency signal generated in the mixer 38 whilst preventing the local oscillator signal and any other unwanted residual frequencies from reaching the output port 138. The IF filter 132 has a cut-off frequency of 22 GHz. The mixer 38 is designed to operate on the fourth harmonic of the local oscillator signal. Consequently, since the local oscillator signal is 23.25 GHz, the fourth harmonic thereof is a frequency of 93 GHz, and, with the radio-frequency signal having a frequency of 94 GHz, the intermediate frequency signal exiting the mixer 38 will have a frequency of 1 GHz.

Figure 5A:
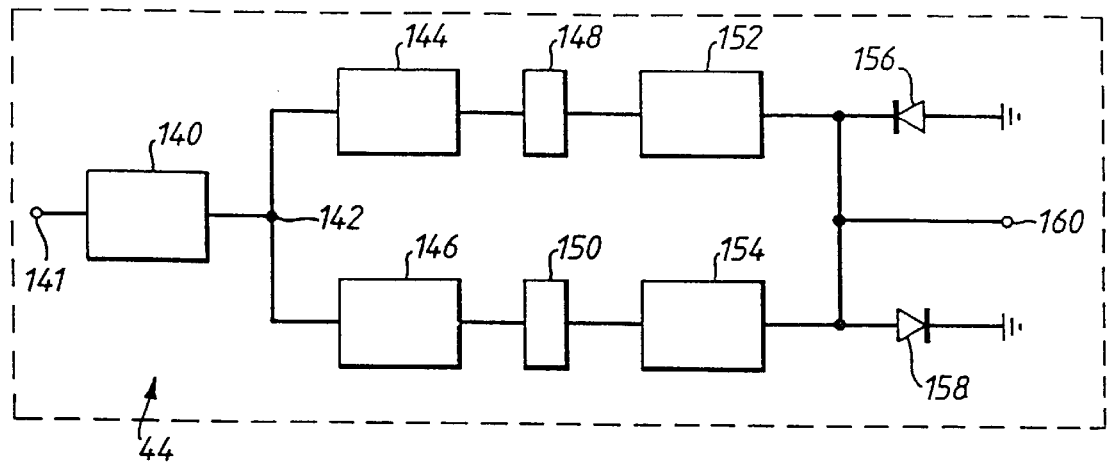
FIG. 5a is a schematic diagram of a microstrip circuit of a linear frequency discriminator component of the voltage controlled oscillator circuit shown in FIG. 2.

FIG. 5a shows the microstrip circuit of the linear frequency discriminator 44 of the closed loop oscillator circuit. The circuit components of the linear frequency discriminator 44 comprise a frequency divider 140 having an input port 141, a power splitter 142, matching networks 144 and 146 for respective resonators 148 and 150, matching networks 152 and 154 for respective diodes 156 and 158, and an output port 160. Since the LFD 44 is located in the digital section of the radar system that is housed, for example, in a separate power pack unit, the transmission lines connecting the circuit components together need not be of microstrip construction, but can be produced by printed circuit techniques or by wire. During the operation of the closed loop oscillator circuit, the frequency divider 140 divides the intermediate frequency signal received at the input port 141 down to a range which is suitable for digital operation, e.g., MHz frequency, and feeds that divided signal to the power splitter 142, which performs a 3 dB power split of the signals. The split signal thus produced are fed respectively to the matching networks 144 and 146 for the respective resonators 148 and 150. The resonators 144 and 146 shown in FIG. 5a are quartz resonators, but they could be tuned passive circuits, tuned amplifiers or cavities, if desired, and, since the LFD 44 is located in the digital section of the radar system and may be housed, e.g., in a separate power pack unit, they could also be digital notch filters. The networks 144, 146, 152 and 154 can be passive or active matching networks. The pair of matching diodes 156 and 158 are arranged in an anti-parallel configuration, and are used to produce an output signal at the output port 160, as will now be described with reference to the graphs shown in FIGS. 5b and 5c.

Figure 5B:
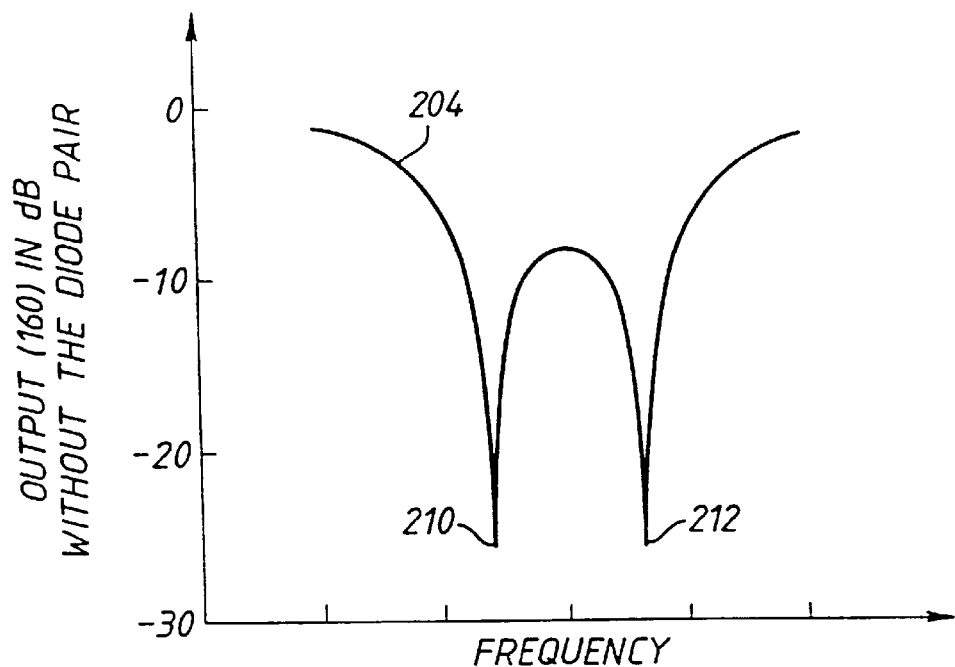
Figure 5C:
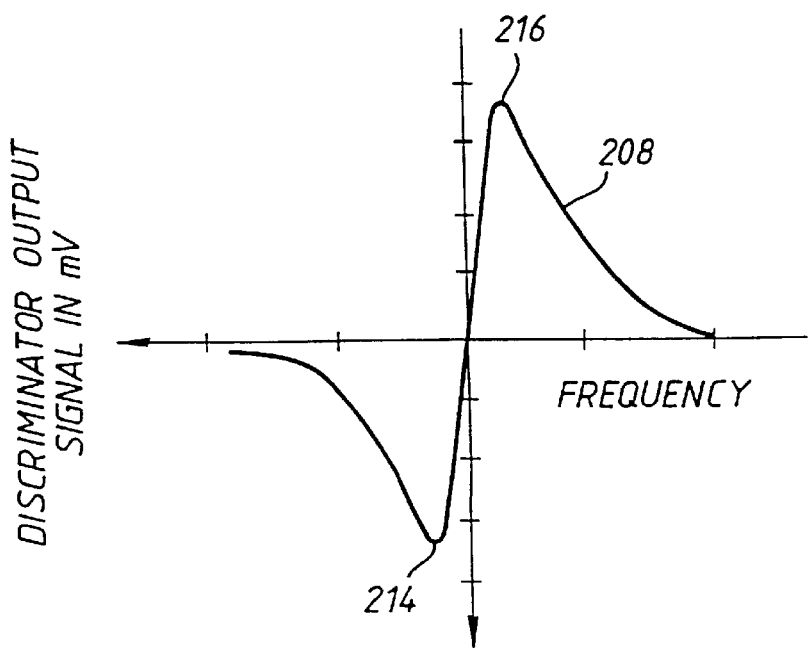

Referring first to FIG. 5b, this shows a graphical representation of the output 204 of the matching networks 152 and 154 when the RF signal at the input port 141 is scanned over the frequency range. As can be seen from the graph, the curve for the output 204 contains two troughs therein, indicated by the reference numbers 210 and 212 respectively. Trough 210 corresponds to the resonant frequency of the resonator 148, and trough 212 corresponds to the resonant frequency of the resonator 150. When the output signal 204 is fed to the pair of diodes 156 and 158, a discriminator output signal is produced at the output port 160 as a result of this diode pair combining the output signal 204, which discriminator output signal 208 is shown graphically in FIG. 5c. As can be seen in FIG. 5c, the curve for the output signal 208 contains a trough 214, which corresponds to the resonance trough 210 shown in FIG. 5b, and a peak 216, which corresponds to the resonance trough 212 shown in FIG. 5b.

As can been seen in FIG. 2, the output signal from the LFD 44 is fed to a negative input port on the summing amplifier 46, wherein it is combined with the saw-tooth voltage signal from the linear ramp generator 48, which is fed to a positive input of the summing amplifier 46, to produce an output signal which is fed to an input of the voltage-controlled oscillator 34.

Figure 6A:
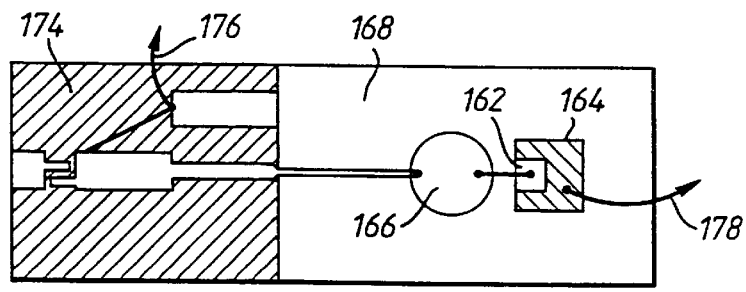
FIG. 6a is a plan view of a voltage-controlled oscillator component of the voltage controlled oscillator circuit shown in FIG. 2.
Figure 6B:
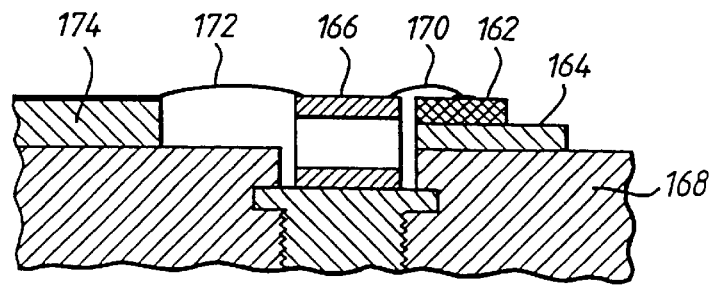
FIG. 6b is a cross-sectional view of a voltage-controlled oscillator component of the voltage controlled oscillator circuit shown in FIG. 2.

FIGS. 6a and 6b show details of the structure of the voltage-controlled oscillator 34. The main circuit components of the VCO 34 comprise a varactor 162, a bypass capacitor 164 and a Gunn diode 166, all mounted upon a metal carrier 168. As can be seen in FIG. 6b, the Gunn diode 166 has a threaded base which is screwed into a threaded aperture in the metal carrier 168, the varactor 162 is bonded to the Gunn diode 166 by a wire 170, and a gold ribbon 172 connects the Gunn diode to a two-section transformer 174 which is used for an impedance match in the VCO 34. As can be seen in FIG. 6a, a Gunn bias line 176 is provided which is connected to a power supply cable 102, and a varactor bias line 178 is provided which is connected to the output line 35 from the summing amplifier 46 (see FIG. 2). The VCO 34 includes a dielectric substrate material of alumina, RT/duroid 5880 or Z-cut quartz.

Figure 7:
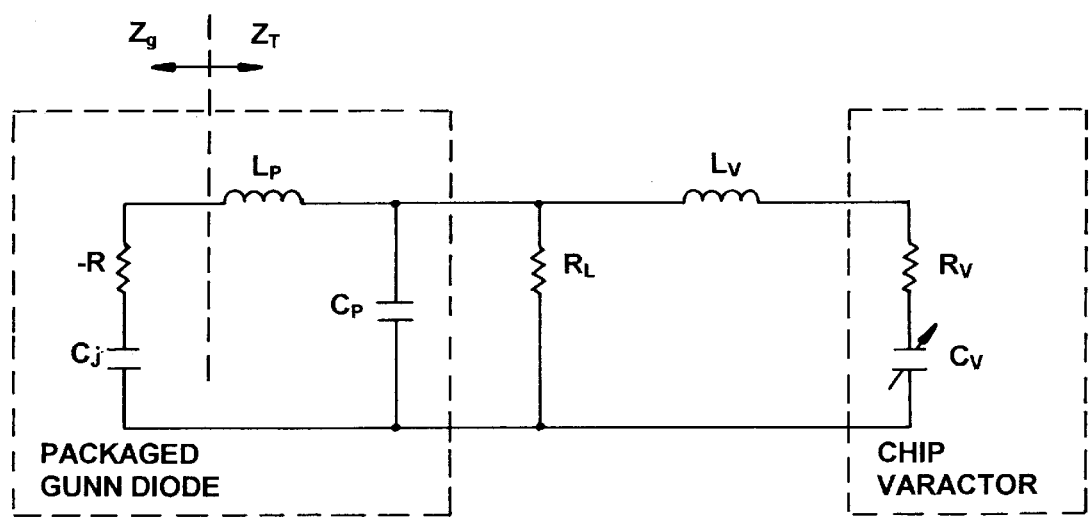
FIG. 7 is a schematic circuit diagram of the equivalent circuit of the varactor controlled oscillator circuit.

The equivalent circuit of the Gunn VCO 34 is given in FIG. 7. It contains the following circuit elements:

| Gunn Diode 166 | |
| --- | --- |
| Negative resistance: –R, | Junction capacitance: $C_j$ |
| Package inductance: $L_p$, | Package capacitance: $C_p$ |
| Transformner 174 | Varactor 162 |
| Transformed load impedamce: $R_L$ | Series resistance: $R_V$ |
| Bonding wire inductance: $L_V$ | Capacitance: $C_V$ |

When the varactor chip is disconnected, the Impedance of the Gunn $Z_g$ is given by:

$$Z_g = -R - \frac{i}{\omega C_j} \quad (1)$$

The impedance of the varactor $Z_V$ is given by:

$$Z_v = R_v + i\left(\omega L_v - \frac{1}{\omega C_v}\right) \quad (2)$$

The time constant $$\tau_1 = R_L C_p \quad (3)$$

The transformed impedance $Z_T$ can be expressed in terms of $Z_V$, $\tau_1$, $R_L$ and $L_p$ i.e.

$$Z_T = i\omega L_p + \frac{R_L Z_V}{R_L + Z_v(1 + i\omega\tau_1)} \quad (4)$$

The following two equations specify the conditions for oscillation:

$$Im(Z_g) = -Im(Z_T) \quad (5)$$

$$Re(Z_g) > Re(Z_T) \quad (7)$$

If the values of the Gunn diode impedance $Z_g$ and of the transformed impedance $Z_T$ given by equations (1) and (4) respectively are inserted into the equation for the oscillation condition given by equation (5) one obtains the following expression for the Gunn diode junction capacitance $C_j$:

$$C_j = \frac{1 + \omega^2 \tau_1^2}{\omega^2 L_p - \omega^2 R_L \tau_1 + \omega^4 \tau_1^2 L_p} \quad (8)$$

since $\tau_1 = R_L C_p$ the Gunn diode junction capacitance is completely determined by the transformed load impedance and the package parasitics $C_p$ and $L_p$.

The impedance of the Gunn diode $Z_g$ given by equation (1) can now be calculated by refering to the equivalent circuit. The Gunn diode impedance includes the negative resistance of the diode and the reactance $X_g$ which is determined by the junction capacitance $C_j$ i.e $$Im(Z_g) = -\frac{\omega R_L \tau_1}{1 + \omega^2 \tau_1^2} \quad (9)$$

Let the reactance of the varactor be $X_V$ where $$X_v = \left(\omega L_v - \frac{1}{\omega C_v}\right) \quad (10)$$

also let $$R_2 = R_L + R_V - \omega \tau_1 X_V \quad (11)$$

and $$X_2 = X_V + \omega \tau_1 R_V \quad (12)$$

It can be shown by using the equivalent circuit that the imaginary part of the transformed impedance $Z_T$ is: i.e.

$$Im(Z_T) = \omega L_p + \frac{R_L(R_2 X_V - R_V X_2)}{R_2^2 + X_2^2} \quad (13)$$

The tuning range of the Gunn diode can now be determined by using the first condition of oscillation given by equation (5) along with the expressions for $Im(Z_g)$ and $Im(Z_T)$ given by equations (9) and (13).

Figure 8:
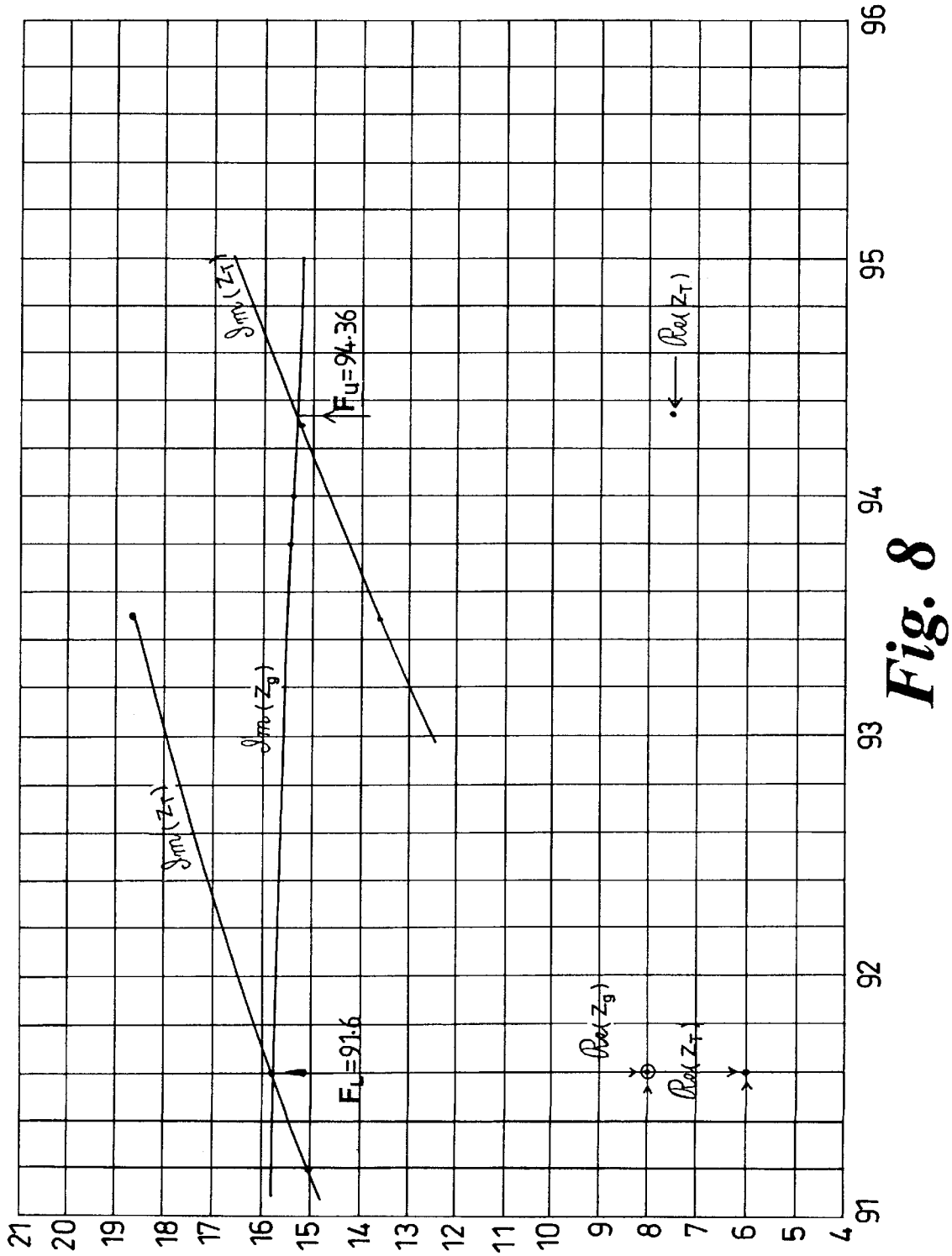
FIG. 8 is a graphical representation of the tuning range of the varactor controlled oscillator circuit.

As shown in FIG. 8, the tuning range is found by using the following procedure:
(i) Choose a value of $C_V$ which represents a good approximation to its value at the lower limit of the tuning range. Using this value of $C_V$:
(ii) plot $Im(Z_g)$ given by equation (9) versus frequency for those frequencies which lie between the lower and upper limits.
(iii) plot $Im(Z_T)$ given by equation (13) versus frequency on the same graph for those frequencies which lie below and above the lower limit.

(iv) The value of the frequency at the point of intersection of these two graphs gives the lower limit of the tuning range.

(v) Choose a value of $C_V$ which represents a good approximation to its value at the upper limit of the tuning range.

(vi) Using this value of $C_V$ repeat steps (ii) and (iii) of the above procedure, except that replace "lower limit" with "upper limit" in step (iii).

(vi) The value of the frequency at the point of intersection of the two graphs obtained in step (vi) gives the upper limit of the tuning range.

(vii) The difference between the frequencies obtained in steps (vi) and (iv) yields the tuning range.

Circuit Elements of the Gunn VCO

The tuning range of the Gunn VCO was found from the graphs of $Im(Z_g)$ and $Im(Z_T)$ versus frequency presented in FIG. 8. The graphs were obtained by following the above procedure. The values assigned to the circuit elements were:

$L_p$=0.08 nanoH.

$C_p$=0.11 pF $R_V$=2.3 ohms $L_V$=0.08 nanoH $C_V$=0.12 pF (Lower limit of tuning range)

$C_V$=0.086 pF (Upper limit of tuning range

The Gunn diode negative resistance: $-R$=$-8$ ohms.

The points of intersection of the lower and upper limits of the tuning range are (91.6 GHz, 15.7 ohms). and (94.36 Ghz, 15.25 ohms) respectively.

This Yields a Tuning Range of 2.76 GHz

The resistances $Re(Z_g)$ and $Re(Z_T)$ have been plotted on the graph in FIG. 8 to show that the condition $Re(Z_g)>Re(Z_T)$ (7) is satisfied.

Note that $Re(Z_T)$=6 and 7.5 ohms at 91.6 and 94.35 GHz respectively, since $Re(Z_g)$=8 ohms equation (7) is satisfied.

A two section transformer 174 is inserted between $Z_L$ and $Z_g$ to provide impedance matching between $R_L$ and $Z_o$.

The conditions for oscillation are:

(i) the real part of the Gunn device impedance must be greater than the transformed load impedance, given by equation (7), and (ii) that the imaginary part of the device impedance must be a conjugate match to that of the transformed load impedance.

Figure 9:
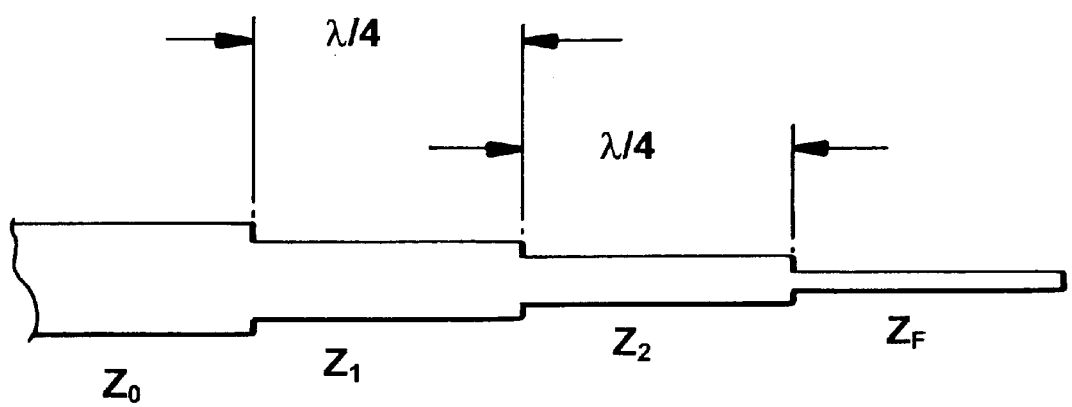
FIG. 9 is a schematic diagram of a microstrip circuit of a two-section transformer component of the varactor controlled oscillator circuit.

The two section transformer 174 that matches the transformed impedance $R_L$=250 ohms to $Z_o$=50 ohms is shown in FIG. 6a and in greater detail in FIG. 9.

The impedance $Z_{F=RL}$, $Z_2$=139 ohms and $Z_1$=77.15 ohms.

Line Widths

The linewidths can be estimated to within 1% by using the following formula for the ratio $\rho$=W/h for narrow strips {i.e. when $Z_o>(44-2\epsilon_R)$ ohms}:

$$\rho = \frac{8\exp(H')}{\exp(2H')-2} \quad (14)$$

$$H' = \frac{Z_o[2(\epsilon_R+1)]^{1/2}}{119.2} + \frac{1}{2}\zeta\xi \quad (15)$$

where $$\zeta = \frac{\epsilon_R-1}{\epsilon_R+1} \quad (16)$$

and $$\xi = \ln(\pi/2)+(1/\epsilon_R)\ln(4/\pi) \quad (17)$$

W is the linewidth and h is the thickness.

TABLE 1

Linewidths of 50 ohm lines.

| | $\epsilon_R$ | h mm | W mm | $\rho$ |
|---|---|---|---|---|
| | | $Z_2$ = 139 ohms | | |
| RT Duroid 5880 | 2.2 | 0.127 | .04826 | .38 |
| | | 0.254 | .09652 | |
| Quartz | 4.5 | 0.12 | .017583 | 0.1465 |
| | | 0.35 | .051275 | |
| | | $Z_1$ =77.15 ohms | | |
| RT Duroid 5880 | 2.2 | 0.127 | 0.2032 | 1.6 |
| | | 0.254 | 0.38 | |
| Quartz | 4.5 | 0.35 | 0.2843 | 0.8122 |

TABLE 2

Linewidths of 50 ohm lines $Z_0$ = 50 ohms

| | $\epsilon_R$ | h mm | W mm | $\rho$ |
|---|---|---|---|---|
| RT Duroid 5880 | 2.2 | 0.127 | 0.3978 | 3.132 |
| | | 0.254 | 0.7956 | |
| Quartz | 4.5 | 0.35 | 0.658 | 1.88 |

The linewidths W are given for two separate thicknesses for RT Duroid 5880 when $Z_2$=139 ohms and again when $Z_1$=77.15 ohms. The linewidths are also given for Quartz for two separate thicknesses when $Z_2$=139 ohms but for only one value when $Z_1$=77.15 ohms. The VSWR for a particular bandwidth is given on page 267 in Microwave Filters, Impedance Matching Networks and Coupling Structures by Matthaei, Young and Jones. For this case:

VSWR=1.8,

Impedance ratio: 5,

Bandwidth=1.0

The linewidths of 50 ohm lines are given in Table 2.

Referring now to FIG. 5c, in particular to the linear portion of the curve of the output signal that occurs between the trough 214 and the peak 216, this graph has a scale of 10 MHz/division for the frequency and 5 mv/division for the output signal voltage. Thus the linear region of the curve between the trough 214 and the peak 216 has a slope of 0.5 mv/MHz, and represents the sensitivity of the linear frequency discriminator 44. If each one of the matching networks 144,146, 152 and 154 has a gain of 5, then the path from the power splitter 142 to the signal output 160 via either resonator 148 or resonator 150 has an overall gain of 25. This produces a sensitivity of 12.5 mv/MHz for the discriminator 44. The matching networks 144, 146, 152 and 154 can be formed from FETs (Field effect Transistors) which can incorporate the necessary gain.

Figure 1:
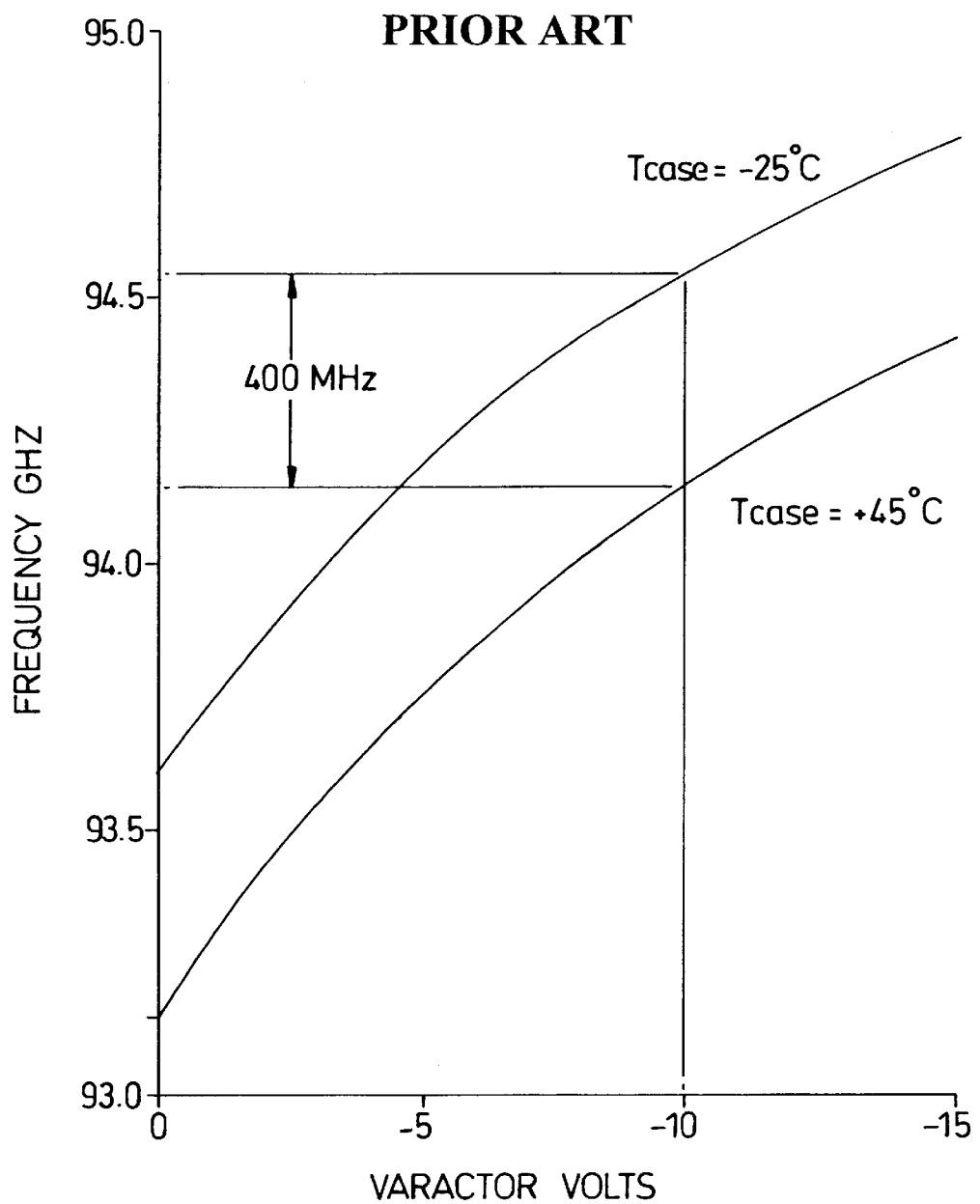
FIG. 1 is a graphical representation of the tuning performance of a prior art varactor controlled Gunn diode mounted in a waveguide cavity.

The sub harmonic mixer 38 shown in FIG. 4 has a conversion loss of 20 dB. The amplifier 42 in FIG. 1 has a gain of 43 dB, giving an overall loop gain of 200, or 23 dB. The discriminator sensitivity of 12.5 mv/MHz plus the closed loop gain of 200 produces a 0.5% variation in linearity, which is more than adequate for a constant slope of output frequency against input voltage. The accepted value for the variation from linearity is 1%.

Parameters for the preferred embodiment of the present invention are as follows:

| | |
|---|---|
| Carrier signal frequency: | 94 GHz |
| Closed loop local oscillator frequency: | 23.25 GHz |
| Sub harmonic (N = 4) mixer conversion loss: | 20 dB |
| Closed loop intermediate frequency: | 1 GHz |
| Closed loop amplifier gain: | 43 dB |
| Linear frequency discriminator sensitivity: | 12.5 mv/MHz |

The fabrication of the closed loop oscillator circuit of the preferred embodiment of the present invention involves the use of various dielectric substrates for supporting the electronic components. Any dielectric substrate having a sufficiently high dielectric constant and sufficient structural strength may be used for this purpose.

Thus, for example, suitable dielectric substrates could be formed from polytetrafluoroethylene (dielectric constant of 2.45), quartz (dielectric constant of 4.5), alumina (dielectric constant of 9.6), RT/Duroid 6010 (dielectric constant of 10.3), GaAs (dielectric constant of 12.5), fused silica (dielectric constant of 9.3).

The oscillator circuit may be constructed using either of the following fabrication techniques:

(i) Microstrip construction of the RF transmission lines, couplers, filters and other passive elements such as capacitors, inductances and resistors, as well as of the DC bias lines, blocks and bypass capacitors.

Those circuit elements that are not of microstrip construction will be referred to as devices. These are:

(a) the VCO Gunn diode (166)
(b) the LO Gunn/Impatt diode (108)
(c) the dielectric resonator (104)
(d) the harmonic mixer diodes (128)
(e) the feedback loop amplifier (42)
(f) the Linear Frequency Discriminator diodes (156 & 158)
(g) the summing amplifier (46)

These devices are fabricated separately and are "drop-in" components.

(ii) Microstrip construction for the RF transmission lines, couplers, filters and other passive elements such as capacitors, inductances and resistors that operate at 76.5 GHz or 94 GHz. All elements that operate below 30 GHz are constructed as part of a Monolithic Millimeter Wave Integrated Circuit (MMIC)[7].

Thus those devices (b), (c), (e) and (f) in the VCO feedback loop that operate below 30 GHz will make up a single MMIC, while (g) will be a separate MMIC.

A second embodiment of the oscillator circuit will now be described with reference to FIGS. 10 to 12. The oscillator circuit includes a second harmonic oscillator 301, a linear frequency discriminator 302 that operates at frequencies in the J band, i.e. above 500 MHz, and a mixer 303 that is connected to the output of the local oscillator 40 via an input line 304. The discriminator 302 may be constructed from passive microstrip components, i.e. hybrid ring couplers and delay lines.

Figure 13:
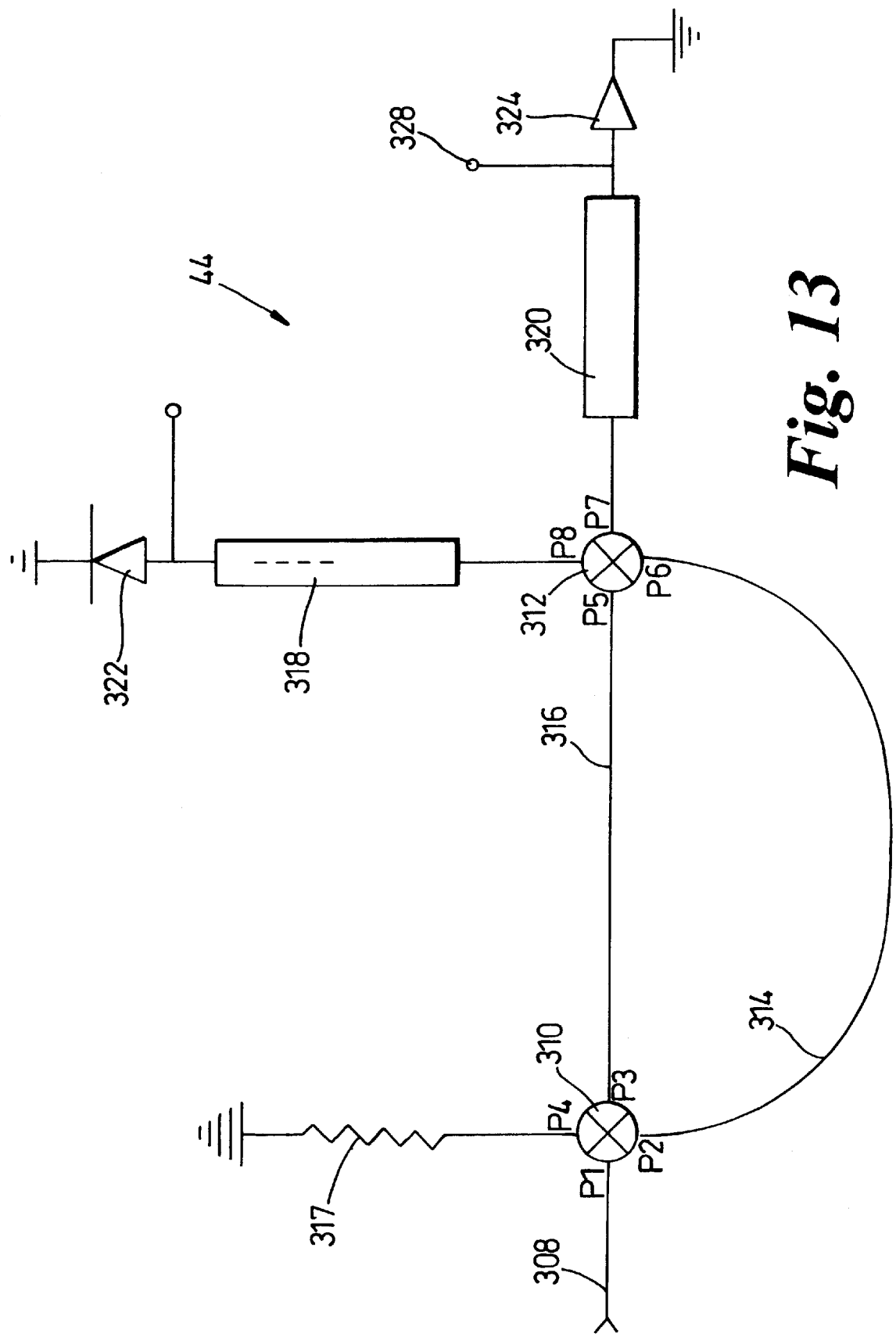
FIG. 13 is a block diagram of a discriminator component of the oscillator circuit.

A block diagram of the linear frequency discriminator 44 is shown in FIG. 13. It consists of the following parts: an input terminal 308; two branch line couplers 310,312; delay and reference paths 314, 316; a microwave load 317; two matching networks 318,320; two output diodes 322,324 and two output terminals 326,328. The output coupler 312 is matched to a diode with nominal parameters. The key parameter is the diode capacitance.

Figure 14:
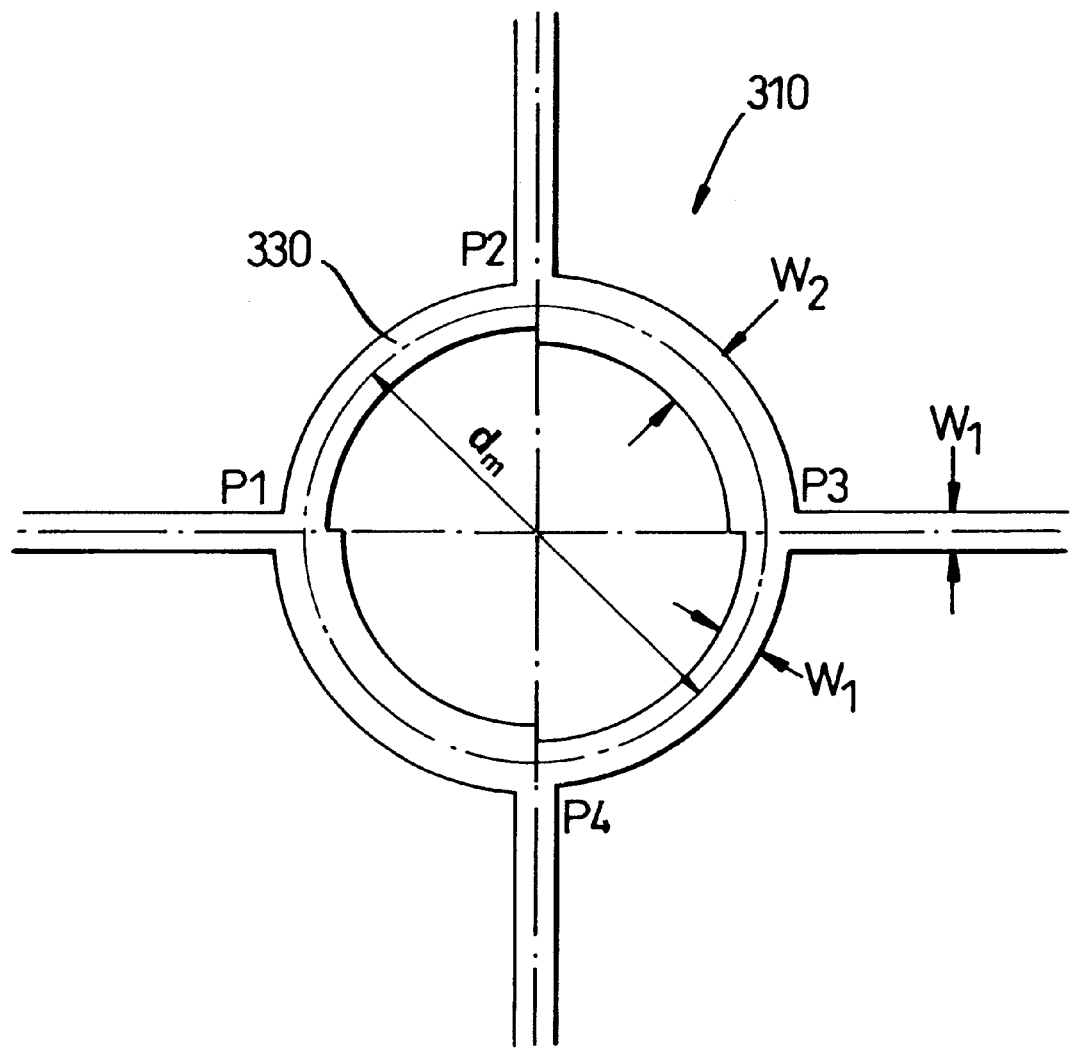
FIG. 14 is a schematic diagram of a microstrip 3 dB Hybrid directional coupler of the discriminator component.

A schematic diagram of a microstrip hybrid-ring directional coupler 310 is shown in FIG. 14 and consists of a ring 330 having four ports labelled P1–P4. The electrical characteristics and the geometrical dimensions of the hybrid-ring directional coupler are as follows:

| | |
|---|---|
| Operating frequency $F_o$ | 18 GHz |
| Characteristic Impedance $Z_o$ | 70 Ohms |
| $W_1$ = Width of 70 ohm line | 0.2257 mm |
| $W_2$ = Width of 50 ohm line | 0.3927 mm |
| diameter $d_m$ | 4.0234 mm |
| Substrate | RT Duroid 5880 |
| Dielectric constant | 2.2 |
| Thickness (height) | 0.127 mm |

The phase shifts $\phi_{P1P2}$ between ports P1 and P2 and $\phi_{P1P3}$ between ports P1 & P3 are:

$$\phi_{P1P2}=2\pi(F/F_o)(1/4)$$

&

$$\phi_{P1P3}=2\pi(F/F_o)(2/4)$$

Figure 15:
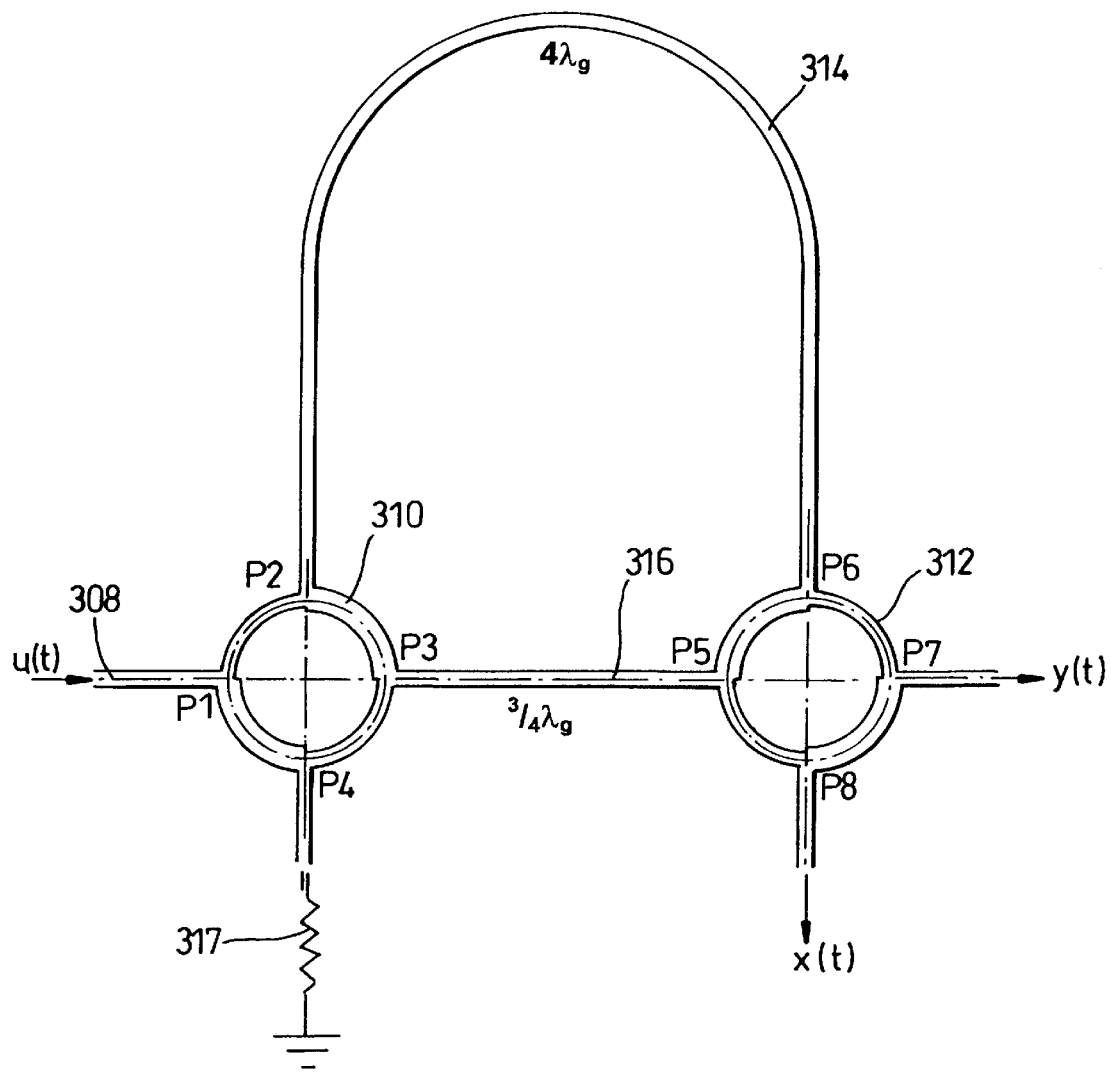
FIG. 15 is a diagram of a part of the discriminator, showing the input and output voltages, phase shifts and the delay and reference attenuation.

$S_{nm}$ is the amplitude split between ports N and M, or the S parameter. Consider a voltage signal u(t)=V cos (2π ft) that enters port P1 and exits port P2. Its amplitude on exit is: $VS_{P2P1}$ The second hybrid-ring directional coupler 312 in the discriminator 44 is shown in FIG. 15 with ports labelled P5–P8. Port P2 is connected to port P6 by the delay path 314. If there is no attenuation in the delay path, the signal that exits port P2 with amplitude $VS_{P2P1}$ enters port P6 and then exits port P8 with an amplitude $VS_{P2P1}S_{P8P6}$.

The amplitude splits are a function of a frequency and will be designated as $S_{nm}$ (F) when so required.

The Delay and Reference paths 314,316 are shown in FIG. 15. The phase shift produced by the delay path 314 is $\phi_{P1P3}=2\pi$ (F/$F_o$) (16/4). It is shown as $4\lambda_g$ in FIG. 15. Similarly the reference path 316 is labelled $(3/4)\lambda_g$.

The attenuation of the delay and reference paths is denoted by $\alpha_d$ and $\alpha_r$ respectively.

The attenuation $\alpha_x$ in any given path x is given by the following expression:

$$\alpha_x = \frac{N_x 27.3 \varepsilon_r (\varepsilon_{eff} - 1)\mathrm{Tan}\delta}{(\varepsilon_{eff})^{1/2}(\varepsilon_r - 1)\lambda_o} \mathrm{dB}$$

Where:
$N_x$ is the number of wavelengths in path x,
x=d indicates the delay path,
x=r indicates the reference path.

Tanδ is the loss tangent of the substrate material.

$\in_r$ is the relative dielectric constant of the substrate material, $\in_{eff}$ is the effective dielectric constant of the substrate material.

Consider FIG. 15 again. Let a signal enter port P1 with unit amplitude. It will exit port P2 with amplitude $S_{P2P1}$, be attenuated by $\alpha_d$ after traversing the delay path, then it will enter port P6 with amplitude $SP_{P2P1}\alpha_d$. Finally it exits port P8 with an amplitude given by:

$$CP_{P2P8}=S_{P2P1}\alpha_d S_{P8P6}$$

and similarly $$C_{P3P8}=S_{P3P1\alpha_r}S_{P8P5}$$

is the amplitude of the signal that exits port P8 after it enters port P1 exits port P3, traverses the reference path 316, enters port P5 and exits port P8.

The amplitudes of the signals that leave port P7 after traversing the delay and reference paths are:

$$C_{P2P7}=S_{P2P1}\alpha_d S_{P7P6}$$

and similarly $$C_{P3P7}=S_{P3P1}\alpha_r S_{P7P5}.$$

Figure 11:
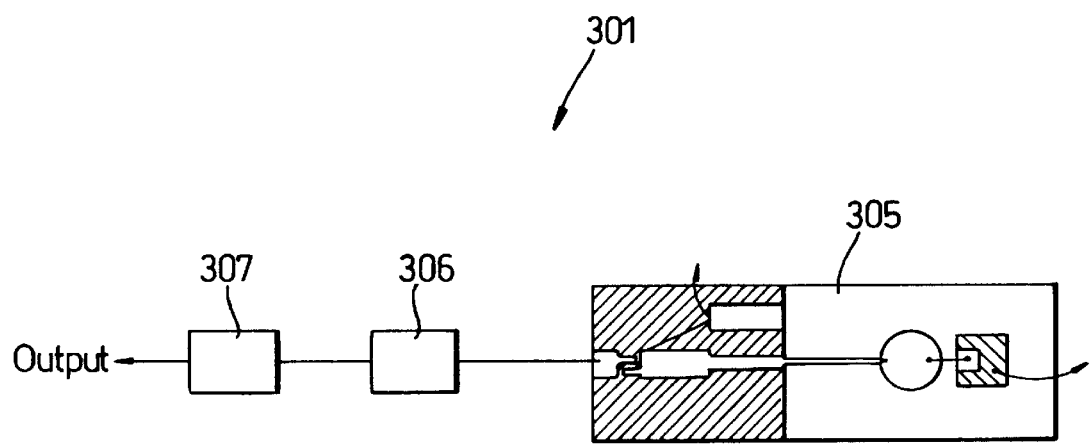
FIG. 11 is a schematic diagram of a second harmonic voltage-controlled oscillator component of the oscillator circuit shown in FIG. 10.

The second harmonic oscillator 301 is shown in detail in FIG. 11 and comprises a planar VCO 305, which is similar to the VCO 34 shown in FIG. 6a, a matching circuit 306 and a band-pass filter 307. The VCO 305 operates at a fundamental frequency of 47 GHz but its output also includes various harmonics of that frequency. The output of the VCO 305 is filtered by the band-pass filter 307, which allows only the second harmonic, at a frequency of 94 GHz, to pass. The output frequency of the second harmonic oscillator 301, comprising the planar VCO 305, the matching circuit 306 and the band-pass filter 307, is therefore 94 GHz.

Figure 12:
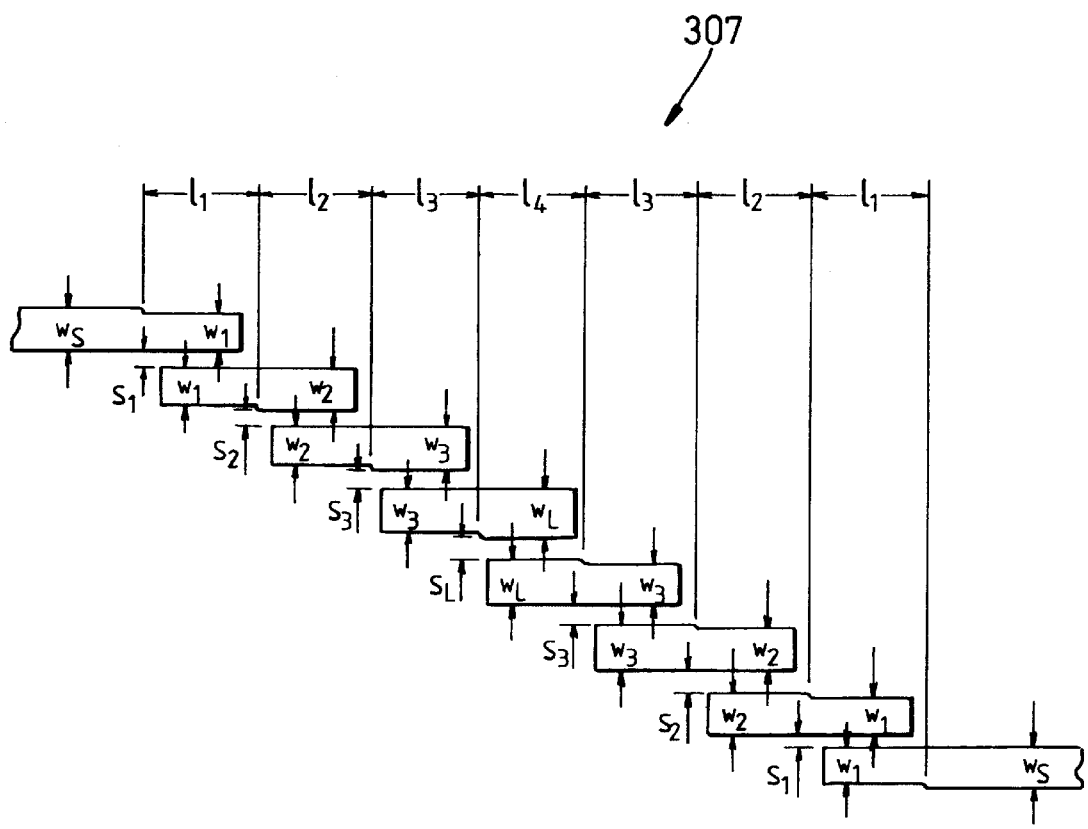
FIG. 12 is a schematic diagram of a microstrip circuit for a seven parallel-coupled band-pass filter component of the oscillator circuit shown in FIG. 10.

The band-pass filter 307 is shown in more detail in FIG. 12 and consists of seven microstrip parallel-coupled resonators. Alternatively, it can be constructed of microstrip resonators that are series-coupled (not shown).

The oscillator circuit shown in FIG. 10 operates as follows. The local oscillator 40 generates an output signal on line 39 at a fixed frequency of 19 GHz. This signal is multiplied by the harmonic mixer 38 up to a frequency of 76 GHz and combined with the 94 GHz signal supplied through line 37 from the coupler 36 to generate a first intermediate signal at the beat frequency of 18 GHz. This signal is fed via the amplifier 42 to the discriminator 302. The output of the discriminator 302 is connected to one input of the mixer 303 (which may be a single ended or double balanced mixer), which combines that signal with the 19 GHz output signal of the local oscillator 40 to produce a second intermediate frequency output signal at the beat frequency of 1 GHz. This signal is fed into one input of the summing amplifier 46 through output line 45 and serves to correct non-linearities and temperature drift in the output of the second harmonic oscillator 301.

The tuning range of the second harmonic oscillator 301 can be determined by modifying the procedure outlined above with respect to the tuning range of the Gunn VCO 34 in the embodiment of FIG. 2, in the following manner. If the output frequency of the band pass filter 307 is (FIGS. 11 and 12) $F_o$, the central frequency of the tuning range will be $(F_o/2)$. In other words, the fundamental frequency will be the central frequency of the tuning range and the output frequency will be the second harmonic.

Figure 10:
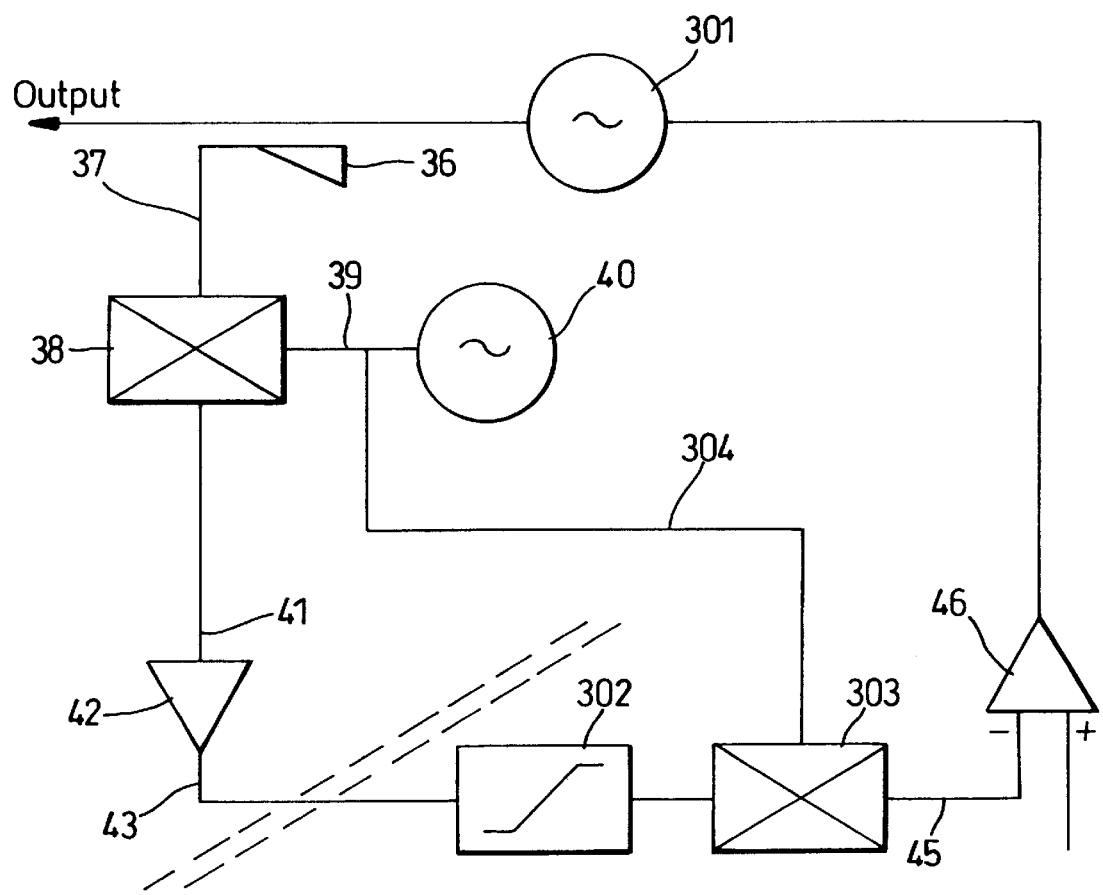
FIG. 10 is a schematic circuit drawing of a voltage controlled oscillator circuit according to a further embodiment of the present invention.

The principle of operation of the closed loop feedback circuit shown in FIG. 10 is based on the fact that the linearity of delay line discriminators is dependent on the frequency of operation. The higher the frequency of these discriminators, the greater the linearity. Therefore, if the second harmonic oscillator 301 and the local oscillator 40 have frequencies of 94 GHz and 19 GHz respectively, the fourth harmonic mixer 38 will produce an intermediate frequency (IF) of 18 GHz which is fed into the delay line discriminator 302. The IF of 18 GHz will produce a deviation from linearity of less than 2% over a 300 MHz bandwidth, and the higher the IF, the smaller the deviation from linearity will be.

The closed loop feedback circuit shown in FIGS. 10 to 12 may be modified to include a harmonic oscillator that uses a higher harmonic by selecting an appropriate VCO 305 and band pass filter 307. For example, in a circuit that uses the $n^{th}$ harmonic, the central frequency of the tuning range will be $(F_o/n)$.

REFERENCES

1. I. Druckier et al, "Medium power GaAs field effect transistors", Electron Letters Vol.11, p.104, March 1975.
2. R. S. Pengelly, "Microwave Field-Effect Transistors— Theory Design and Applications", Research Studies Press, New York 1982, p.77.
3. L. A. D'Astro et al, "Improved performance of GaAs microwave field-effect transistors with low inductance via connections through the substrate", IEEE Trans. Electronic Devices, Vol. ED-25, pp.1218–1221, October 1978.
4. C. A. Mead et al "Schottky barrier gate field-effect transistor", Proc. IEEE, Vol.54, pp.307–308, 1996.
5. R. Dingle et al "Electronic properties of modulation-doped GaAs—AlGaAs heterojunction superlattices", Inst. Phys. Conf. Ser., No. 45, Chap.3, pp.248–255, 1979.
6. L. Y. Baeyens et al "Performance of 0.2 micrometer Planar-Doped Pseudomorphic and Lattice—Matched HEMTs on GaAs and InP", Proceedings of the ESSDERC Conference 1993, pp.753–756.
7. Integriete Mikrowellanschaltungen (Integrated Microwave Circuits) by R. K. Hoffman, Berlin 1983.

What is claimed is:

1. An oscillator circuit including:
    a voltage controlled oscillator (VCO) constructed and arranaed to produce a radio frequency (RF) sianal at an output of the VCO, wherein the frequency of the RF signal corresponds to a voltage applied to an input of the VCO, and
    a closed loop feedback circuit associated with the VCO, the feedback circuit comprising
        a local oscillator (LO) arranged to produce a stabilized LO frequency signal,
        a harmonic mixer having a first input coupled to receive the stabilized LO frequency sianal from the local oscillator and a second input coupled to receive the RF signal from the output of the VCO, the harmonic mixer being arranged to mix the LO frequency signal with the RF signal to obtain an intermediate frequency (IF) sianal, and
        a linear frequency discriminator having an input coupled to receive the IF signal from the harmonic mixer, the discriminator being constructed and arranaed to produce an output voltage signal corresponding to a frequency of the IF signal, and a circuit for applying the output voltage signal to the input of the VCO for stabilizing the frequency of the RF signal produced by the VCO;
            wherein said local oscillator includes a dielectric resonator, a Gunn/Impatt diode coupled to the dielectric resonator, and a low-pass filter coupled to the Gunn/Impatt diode for providing the stabilized LO frequency signal and wherein each of said VCO, local oscillator, and harmonic mixer components are microstrip components arranged to cooperate with one another over a desired operating frequency range.

2. An oscillator circuit according to claim 1, wherein said voltage controlled oscillator includes a voltage-controlled Gunn diode.

3. An oscillator circuit including:
a voltage controlled oscillator (VCO) constructed and arranged to produce a radio frequency (RF) signal at an output of the VCO, wherein the frequency of the RF signal corresponds to a voltage applied to an input of the VCO, and
a closed loop feedback circuit associated with the VCO, the feedback circuit comprising
a local oscillator (LO) arranged to produce a stabilized LO frequency signal,
a harmonic mixer having a first input coupled to receive the stabilized LO frequency signal from the local oscillator and a second input coupled to receive the RF signal from the output of the VCO, the harmonic mixer being arranged to mix the LO frequency signal with the RF signal to obtain an intermediate frequency (IF) signal, and
a linear frequency discriminator having an input coupled to receive the IF signal from the harmonic mixer, the discriminator being constructed and arranged to produce an output voltage signal corresponding to a frequency of the IF signal, and a circuit for applying the output voltage signal to the input of the VCO for stabilizing the frequency of the RF signal produced by the VCO;
wherein said voltage controlled oscillator includes a voltage-controlled Gunn diode, and a two-section transformer connected to said Gunn diode and wherein each of said VCO, local oscillator, and harmonic mixer components are microstrip components arranged to cooperate with one another over a desired operating frequency range.

4. An oscillator circuit including:
a voltage controlled oscillator (VCO) constructed and arranged to produce a radio frequency (RF) signal at an output of the VCO, wherein the frequency of the RF signal corresponds to a voltage applied to an input of the VCO, and
a closed loop feedback circuit associated with the VCO, the feedback circuit comprising
a local oscillator (LO) arranged to produce a stabilized LO frequency signal,
a harmonic mixer having a first input coupled to receive the stabilized LO frequency signal from the local oscillator and a second input coupled to receive the RF signal from the output of the VCO, the harmonic mixer being arranged to mix the LO frequency signal with the RF signal to obtain an intermediate frequency (IF) signal, and
a linear frequency discriminator having an input coupled to receive the IF signal from the harmonic mixer, the discriminator being constructed and arranged to produce an output voltage signal corresponding to a frequency of the IF signal, and a circuit for applying the output voltage signal to the input of the VCO for stabilizing the frequency of the RF signal produced by the VCO;
wherein said voltage controlled oscillator includes a voltage-controlled Gunn diode, a varactor coupled to the Gunn diode, and a bypass capacitor coupled to the varactor and wherein each of said VCO, local oscillator, and harmonic mixer are microstrip components arranged to cooperate with one another over a desired operating frequency range.

5. An oscillator circuit according to claim 1, wherein said voltage controlled oscillator includes a GaAS field effect transistor or a MESFET, HEMT or PHEMT transistor oscillator.

6. An oscillator circuit according to claim 1, wherein at least one of said local oscillator, said harmonic mixer and said linear frequency discriminator comprises a microstrip circuit.

7. An oscillator circuit according to claim 1, wherein at least part of the circuit comprises a monolithic millimeter wave integrated circuit.

8. An oscillator circuit according to claim 1, wherein said closed loop feedback circuit includes an IF amplifier connected between said harmonic mixer and said linear frequency discriminator to amplify said IF signal.

9. An oscillator circuit according to claim 1, wherein said closed loop feedback circuit includes a summing amplifier connected between said linear frequency discriminator and said voltage controlled oscillator, said summing amplifier having a first input that is connected to receive said output voltage signal from said linear frequency discriminator, a second input that is connected to receive a control voltage signal and an output connected to an input of said voltage controlled oscillator to control and stabilise the voltage controlled oscillator.

10. An oscillator circuit according to claim 9, said circuit including a linear ramp generator that is connected to said second input of said summing amplifier, to provide said control voltage signal.

11. An oscillator circuit according to claim 1, said oscillator circuit having an operating frequency in the range 30–220 GHz.

12. An oscillator circuit according to claim 1, said oscillator circuit having an operating frequency of approximately 94 GHz.

13. A stabilized voltage controlled oscillator circuit for operation at millimeter-wave frequencies, said stabilized voltage controlled oscillator circuit comprising:
a voltage controlled oscillator (VCO) constructed and arranged to produce a radio frequency (RF) signal at an output of the VCO, the VCO including a varactor, a Gunn diode arranged to be controlled by said varactor, and an impedance matching device configured to match corresponding operating impedances of the varactor and the Gunn diode, wherein the frequency of the RF signal from the VCO corresponds to a voltage applied to an input of the VCO;
a local oscillator (LO) that includes a dielectric resonator for producing a stabilized LO frequency signal;
a harmonic mixer having a first input coupled to receive the stabilized LO frequency signal from the local oscillator and a second input coupled to receive the RF signal to produced by the VCO, the harmonic mixer being arranged to mix the LO frequency signal with the RF signal to obtain an intermediate frequency (IF) signal;
an IF amplifier coupled to receive the IF signal from the harmonic mixer and for producing a corresponding output signal;
a linear frequency discriminator having an input coupled to receive the output signal from the IF amplifier, the discriminator being constructed and arranged to produce an output voltage signal corresponding to a frequency of the IF signal; and a summing amplifier having a first input that is connected to receive the output voltage signal from said discriminator, wherein said summing amplifier is configured to produce an output signal which is applied to the input of the VCO;

wherein said voltage controlled oscillator, local oscillator, harmonic mixer, IF amplifier, linear frequency discriminator and summing amplifier are arranged in a closed loop configuration such that, during operation, said linear frequency discriminator provides a feedback signal for stabilizing the voltage controlled oscillator, and wherein each of said voltage controlled oscillator, local oscillator and harmonic mixer are microstrip components arranged to cooperate with one another over a desired operating frequency range.

14. An oscillator circuit according to claim 13, wherein said impedance matching device is a two-section transformer.

15. An oscillator circuit according to claim 13, wherein said local oscillator includes a Gunn/Impatt diode and a low-pass filter.

16. An oscillator circuit according to claim 13, wherein said low-pass filter comprises an array of microstrip capacitor and inductance elements.

17. An oscillator circuit according to claim 13, wherein said voltage controlled oscillator includes a varactor and a bypass capacitor.

18. An oscillator circuit according to claim 13, wherein said voltage controlled oscillator includes a GaAS field effect transistor or a MESFET, HEMT or PHEMT transistor oscillator.

19. An oscillator circuit according to claim 13, wherein at least part of the circuit comprises a monolithic millimeter-wave integrated circuit.

20. An oscillator circuit according to claim 13, wherein said summing amplifier has a second input that is connected to receive a control voltage signal, and an output of the summing amplifier is connected to the input of said voltage controlled oscillator to control and stabilize the voltage controlled oscillator.

21. An oscillator circuit according to claim 20, said oscillator circuit including a linear ramp generator having an output that is connected to the second input of the summing amplifier, to provide said control voltage signal.

22. An oscillator circuit according to claim 13, wherein said oscillator circuit has an operating frequency in the range of from about 30 Ghz to about 220 Ghz.

23. An oscillator circuit according to claim 13, wherein said oscillator circuit has an operating frequency of approximately 94 Ghz.

24. An oscillator circuit according to claim 13, including a coupler in operative relation to the output of the VCO, and a microstrip transmission line connected at one end to an output of said coupler and at another end to the harmonic mixer, so that the harmonic mixer is connected to receive the radio frequency (RF) signal from said voltage controlled oscillator.

25. An oscillator circuit according to claim 24, wherein said coupler is a microstrip component.

26. An oscillator circuit according to claim 13, wherein said harmonic mixer includes a radio-frequency bandpass filter, two diodes arranged in an anti-parallel configuration, a low-pass filter, and an intermediate frequency filter.

27. An oscillator circuit according to claim 13, wherein said linear frequency discriminator is a microstrip circuit including microstrip resonators.

28. An oscillator circuit according to claim 27, wherein said linear frequency discriminator includes a frequency divider, a power splitter, matching networks for the resonators, a plurality of diodes, matching networks for respective ones of said diodes, and an output port.

29. An oscillator circuit according to claim 13, wherein said linear frequency discriminator is a microstrip circuit including delay lines.

30. An oscillator circuit according to claim 29, wherein said linear frequency discriminator is a microstrip circuit that includes two branch line couplers, a delay path and a reference path, a microwave load, and two output diodes.

31. An oscillator circuit according to claim 29, wherein said linear frequency discriminator is a microstrip circuit that includes two hybrid ring couplers, a delay path and a reference path, a microwave load, and two output ports.

* * * * *

UNITED STATES PATENT AND TRADEMARK OFFICE
CERTIFICATE OF CORRECTION

PATENT NO : 6,133,795
DATED : October 17, 2000
INVENTOR(S): R. C. Williams

It is certified that error appears in the above-identified patent and that said Letters Patent is hereby corrected as shown below:

Column 14, claim 1, line 3, change "arranaed" to -- arranged --, and change "sianal" to -- signal --.

Column 14, claim 1, line 12, change "sianal" to -- signal --.

Column 14, claim 1, line 17, change "sianal" to -- signal --.

Column 14, claim 1, lines 20-21, change "arranaed" to -- arranged --.

Signed and Sealed this

Eighth Day of May, 2001

Attest:

NICHOLAS P. GODICI

Attesting Officer

Acting Director of the United States Patent and Trademark Office